United States Patent
Mizuno et al.

[11] Patent Number: 6,100,108
[45] Date of Patent: Aug. 8, 2000

[54] METHOD OF FABRICATING ELECTRONIC CIRCUIT DEVICE

[75] Inventors: Naohito Mizuno, Kariya; Shinichi Hirose, Okazaki, both of Japan

[73] Assignee: Denso Corporation, Kariya, Japan

[21] Appl. No.: 09/025,107

[22] Filed: Feb. 17, 1998

[51] Int. Cl.[7] ............ H01L 21/00; H01L 21/44; H01L 21/48; H01L 21/50

[52] U.S. Cl. ............ 438/51; 438/115; 438/119; 438/126

[58] Field of Search ............ 438/FOR 369, 438/FOR 370, FOR 375, 51, 115, 119, 126

[56] References Cited

U.S. PATENT DOCUMENTS

| | | |
|---|---|---|
| 4,622,433 | 11/1986 | Frampton . |
| 4,963,002 | 10/1990 | Tagusa et al. . |
| 5,503,016 | 4/1996 | Koen . |
| 5,554,569 | 9/1996 | Ganesan et al. . |
| 5,554,806 | 9/1996 | Mizuno et al. . |

FOREIGN PATENT DOCUMENTS

6-236034  8/1994  Japan .

Primary Examiner—David E. Graybill
Attorney, Agent, or Firm—Pillsbury Madison & Sutro LLP

[57] ABSTRACT

An electronic circuit device fabrication method securing a bond width of a seal portion when heat treatment is needed in sealing a device cavity by a cap. An electronic part mounting step is executed to secure electronic parts, including a semiconductor acceleration sensor chip, within a package main body by using a silicone group die bonding material and a silicone group silver paste. At a baking step, the package main body mounted with the electronic part is heated to a baking temperature of about 380° C.±5° C. In a sealing step, the package main body and the cap are bonded by a sealing material by executing a heat treatment in a state where the sealing material, comprising a low melting point glass, is interposed between a peripheral edge portion of the cavity in the package main body and the cap. The temperature of the package main body is then heated in the heat treatment to about 365° C.±5° C., which is lower than the baking temperature at the baking step.

15 Claims, 6 Drawing Sheets

METHOD OF FABRICATING ELECTRONIC CIRCUIT DEVICE

CROSS-REFERENCE TO RELATED APPLICATION

This application is related to Japanese Patent Application Nos. Hei 9-31798 filed on Feb. 17, 1997 and Hei 10-5565 filed on Jan. 14, 1998, the contents of which are hereby incorporated by reference.

BACKGROUND OF THE INVENTION

1. Field of the Invention

The present invention relates to a method of fabricating an electronic circuit device in which an electronic part is mounted in a cavity formed in a package main body via a die bonding material and a conductive paste for wiring, and the cavity is sealed in an airtight manner via a cap and a sealing material.

2. Description of Related Art

Conventional semiconductor acceleration sensors used, for example, in an air bag system or ABS (Antislip Braking System) typically include a metal can package of a pin inserting type. However, in a semiconductor acceleration sensor using a can package, the number of parts is often large, the structure is complicated and the total configuration size is magnified. Further, since the sensor is of a pin inserting type, the process of mounting the sensor to a printed circuit board or the like is troublesome.

In recent years, semiconductor acceleration sensors that utilize a ceramic package of a surface mount type have been developed to resolve the above-described problem. That is, electronic parts of a semiconductor acceleration sensor chip, an IC (Integrated Circuit) chip for processing the sensor output and the like are die-bonded into a cavity formed in a ceramic package main body having terminals for surface mount. The cavity is then sealed in an airtight manner by a cap.

In this case, sealing by high temperature solder, sealing by resin, sealing by low melting point glass or the like is conceivable for sealing the cap. However, in carrying out sealing by high temperature solder, thick wall gold plating is needed for an electrode installed to the package. Therefore, the package itself per se becomes expensive. Further, in carrying out sealing by resin, it is difficult to maintain the airtight state of the sealed space over a long period of time since it has minimal humidity resistance. Therefore, conventionally, the sealing by glass having a low melting point has generally been adopted.

Further, depending on the state of mounting a semiconductor acceleration sensor chip, it may be required to alleviate stress at a die-bonded portion thereof. Therefore, a silicone group die bonding material having a low Young's modulus is used. Further, when wiring of electronic parts is needed, a silicone group silver paste capable of curing simultaneously with the silicone group die bonding material is used as a conductive paste for the wiring.

In carrying out detailed measurement, including transmission X-ray observation, of a semiconductor acceleration sensor which has been manufactured by being processed by a step of sealing a cap by glass having a low melting point as described above, it has been found that a bond width of a glass seal portion may be thin compared with a predicted width. Further, occurrences of a phenomenon in which a void is caused at the glass seal portion, and a phenomenon showing a state where a cap is inclined form a regular attaching state have been observed.

It seems that such phenomena occur due to gases generated from the silicone group die bonding material and the silicone group silver paste. That is, in the cap sealing step, a heat treatment is performed for elevating the temperature of the low melting point glass to the melting point temperature. It has been found that, in accordance with such a heat treatment, gases produced by thermal decomposition are generated from the silicone group die bonding material and the silver paste. The inner pressure of the cavity is also considerably increased which causes thinning of the bond width of the glass seal portion, voids and the like. It is conceivable that such phenomena are also present when using a die bonding material and a conductive paste other than those of the silicone group. At any rate, deterioration in quality of a finished product may be caused due to deterioration in the reliability of sealing, or mount failure caused by the inclination of a cap may result in mounting the finished product on the surface.

SUMMARY OF THE INVENTION

The present invention has been carried out in view of the above-described situation. It is an object of the present invention to provide a method of fabricating an electronic circuit device in which an electronic circuit device is fabricated by mounting an electronic part inside of a cavity formed in a package main body by using at least one of a die bonding material and a conductive paste for wiring. Even where a heat treatment is needed in sealing the cavity by a cap, seal reliability is achievable by providing a bond of sufficient thickness achieved.

According to a first aspect of the present invention, a baking step, in which a package main body mounted with an electronic part is heated to a baking temperature set to a value higher than a heating temperature of a heat treatment in a sealing step, is carried out for a predetermined time period prior to the sealing step. During the sealing step, the package main body and the cap are bonded by a sealing material. During the baking step, gases are generated by thermally decomposing a die bonding material or a conductive paste used for mounting the electronic part. However, the gases are discharged outside of the cavity.

Thereafter, by performing the sealing step, that is, the heat treatment in a state where the sealing material is interposed between a peripheral edge portion of the cavity in the package main body and the cap for sealing the cavity, the sealing step of bonding the package main body and the cap is carried out. The heating temperature of the package main body of the heat treatment in this case is lower than a baking temperature at the baking step. Therefore, the amount of thermally-decomposed gases generated from the die bonding material and the conductive paste is considerably less than in the case where the baking step is not performed. Therefore, there is no concern of increasing significantly the inner pressure of the cavity as in the conventional case. Also, the phenomenon of thinning the bond width of the seal portion caused by the increase in the inner pressure, the phenomenon of inclining the chip from a regular attaching state, and the like are not caused. As a result, seal reliability can sufficiently be ensured. Also, there is no concern of resulting quality deterioration of an electronic circuit device that is an object of fabrication. In addition, there is no concern of resulting mount failure caused by the inclination of the cap in surface-mounting the completed electronic circuit device.

When heat treatments at the baking step and the sealing step are carried out as lot processings of a plurality of pieces of the package main bodies as in a second aspect of the present invention, manufacturing productivity is increased.

According to a third aspect of the present invention, when such lot processings are carried out, a situation may occur where the heating temperatures at the baking step and the sealing step are dispersed with respect to the package main bodies. In the case where the heat treatments are carried out such that a predetermined temperature difference is constituted between a minimum value of the baking temperature and a maximum value of the heating temperature, an effect equivalent to that of the first aspect of the present invention can be expected to all the package main bodies in the lot, which amounts to promotion in the yield.

According to a fourth aspect of the present invention, when the baking step is carried out for a time period equal to or longer than a time period of the heat treatment at the sealing step, the amount of thermally-decomposed gases generated in the sealing step can be reduced and therefore, an increase in the inner pressure of the cavity can further be avoided.

In a fifth aspect of the present invention, when glass is used as a sealing material, the seal space can be maintained over a long period of time. Further, a special fabrication step is not needed on the side of the package main body. Therefore, reduction in manufacturing cost can be realized.

According to a sixth aspect of the present invention, in mounting an accelerometer sensor chip as an electronic part, a silicone group die bonding material generally having a low Young's modulus is used for die-bonding the sensor chip. Accordingly, stress at the die-bonded part can be alleviated and deterioration in detection accuracy of the kinematic amount sensor chip can be prevented beforehand.

According to a seventh aspect of the present invention, when at least one of a silicone group die bonding material and a silicone group conductive paste is used for mounting an electronic part, the heating temperature at the sealing step, and the baking temperature at the baking step, are lower than about 400° C., which is a heat resistant temperature for each of a general silicone group die bonding material and a general silicone group conductive paste. Accordingly, thermal deterioration of the silicone group die bonding material and the silicone group conductive paste can be prevented beforehand.

When an electronic circuit device is constituted in accordance with an eighth aspect of the present invention, a situation where a metal part in the electronic circuit device is oxidized by the high temperature during the baking step and the sealing step, can effectively be prevented since the heat treatments are carried out in a nonoxidizing atmosphere.

DETAILED DESCRIPTION OF THE PREFERRED EMBODIMENTS

The following explains how the present invention is applied to a method of fabricating a semiconductor acceleration sensor used in an air bag system of an automobile.

Figure 2:
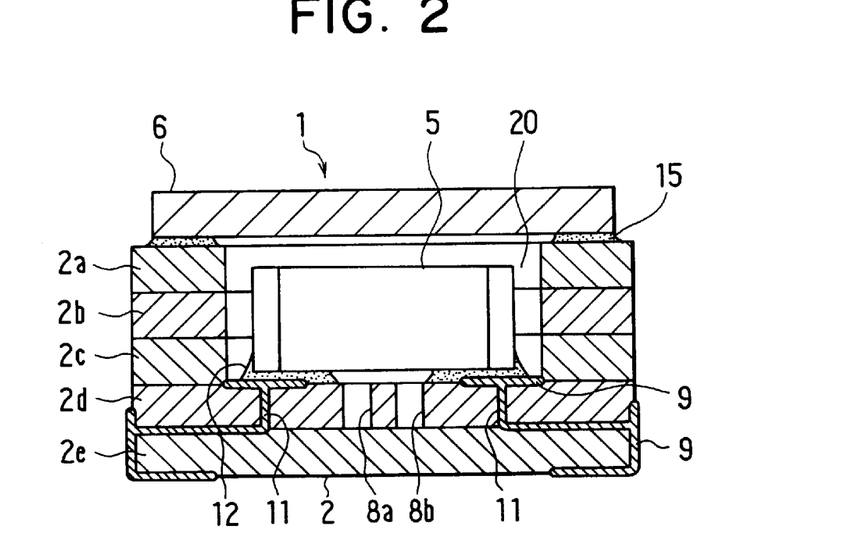
FIG. 2 is a longitudinal sectional front view of a semiconductor acceleration sensor.
Figure 3:
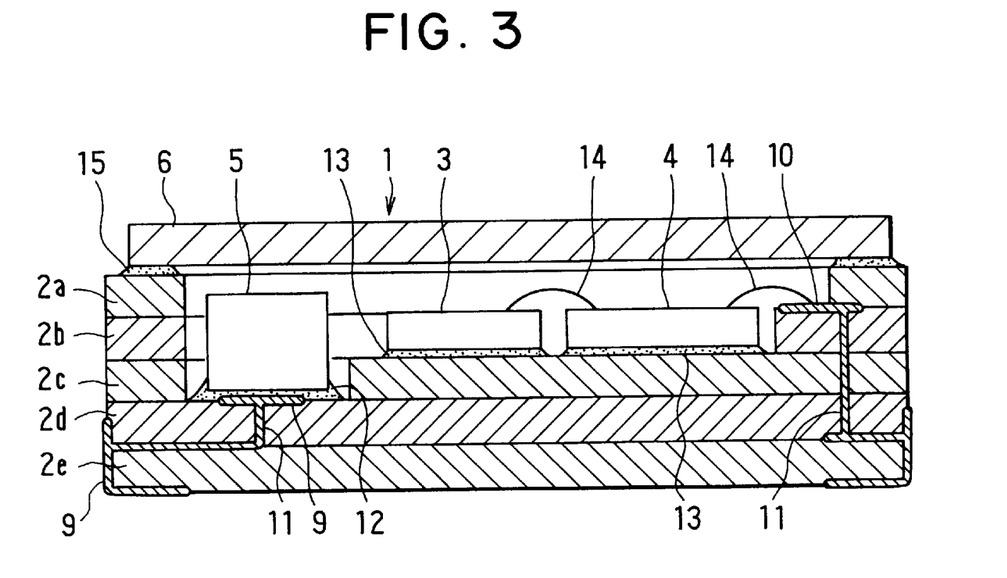
FIG. 3 is a longitudinal sectional side view of a semiconductor acceleration sensor.

FIG. 2 and FIG. 3 show a longitudinal sectional front view and a longitudinal sectional side view of a semiconductor acceleration sensor in a finished state.

In FIG. 2 and FIG. 3, a semiconductor acceleration sensor 1 (corresponding to an electronic circuit device of the present invention) is provided with a structure in which a semiconductor acceleration sensor chip 3 (kinematic amount sensor chip) in correspondence with an electronic part according to the present invention, a signal processing IC chip 4 and a chip condenser 5 are respectively arranged in a cavity 20 of a package main body 2 in a shape of a flat rectangular vessel by using surface mount technology and the cavity 20 is sealed by a cap 6 in an airtight manner.

The above-described semiconductor acceleration sensor chip 3 is provided with a well-known structure having a strain gage and the IC chip 4 for signal processing carries out signal processing for obtaining acceleration information on the basis of an amount of displacement of the strain gage in the semiconductor acceleration sensor chip 3.

The above-described package main body 2 and cap 6 are formed by a ceramic material and according to one embodiment, alumina is used. In this case, the package main body 2 is fabricated by a well-known green sheet laminating process and is provided with a shape where, for example, 5 sheets of alumina substrates 2a through 2e are laminated.

Figure 4A:
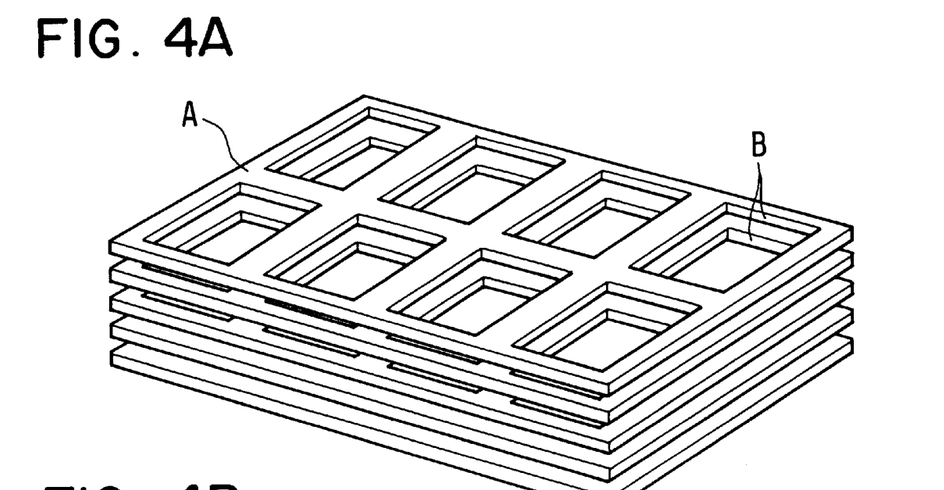
FIGS. 4A, 4B and 4C are perspective views showing a fabrication process of a package main body.
Figure 4B:
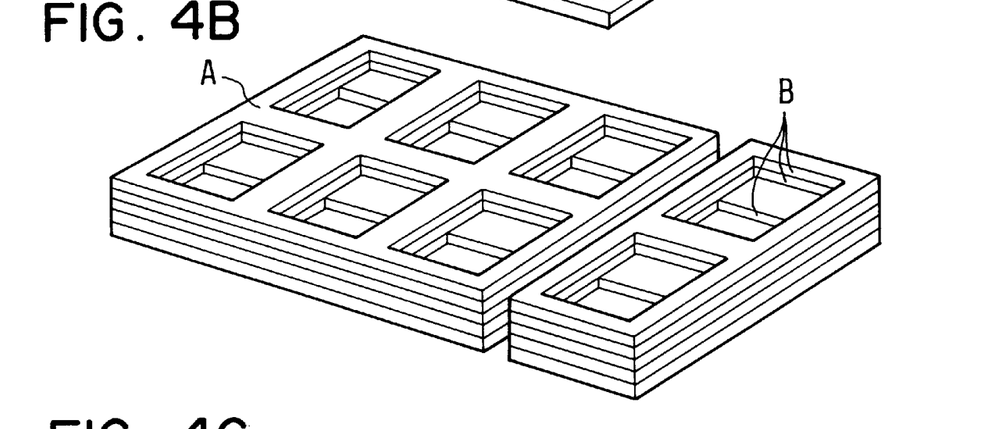
Figure 4C:
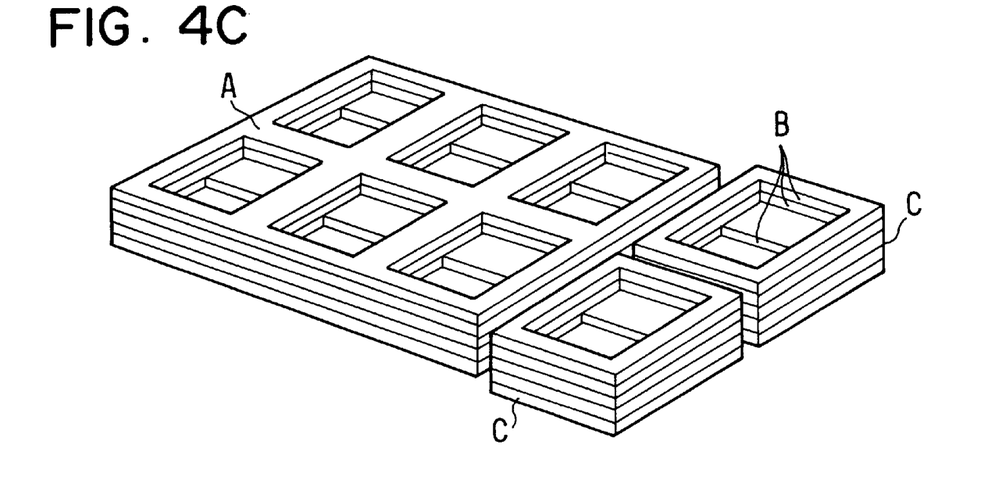
Figure 5:
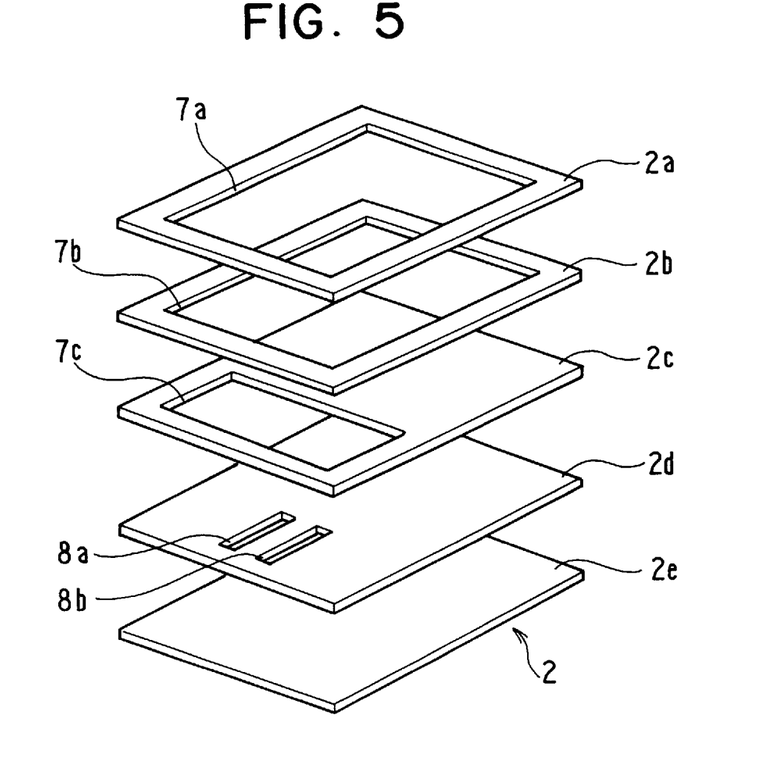
FIG. 5 is an exploded perspective view showing a layer structure of a package main body.

FIGS. 4A, 4B and 4C show outline of a process of fabricating the package main body 2 and an explanation will be given of the fabrication process also in reference to FIG. 5 showing the layer structure of the package main body 2 as follows.

In fabricating the package main body 2 comprising alumina by the green sheet laminating process, for example, 5 sheets of green sheets A formed from materials such as alumina powder, mineral powder, organic binder and the like, are prepared. As shown by FIG. 4A, in respect of, for example, the upper 4 sheets, a group of punch holes B having predetermined shapes (shapes respectively in correspondence with openings 7a through 7c of substrates 2a through 2c and openings 8a and 8b of a substrates 8d in FIG. 5), are formed.

Further, the openings 7a and 7b are shaped in correspondence with the opening of the cavity 20, and the opening 7c is shaped in correspondence with dimensions of the outer shape of the chip condenser 5. Further, the openings 8a and 8b slit shaped and formed in parallel with each other in an orientation orthogonal to the longitudinal direction of the condenser 5 at a portion of mounting the chip condenser 5.

Referring to FIGS. 2 and 3, tungsten conductive films (not shown in FIGS. 4A, 4B and 4C) including matrices of built-in wirings with a conductor pattern 9 for wiring and a conductor pattern 10 for bonding, are formed by printing by using a conductive paste (tungsten paste in this embodiment). Incidentally, although in FIGS. 4A, 4B and 4C, illustration of a state of laying the built-in wirings is omitted, a normal wiring structure is provided on the sheet face. The constitution is also provided with a wiring structure that includes through holes (designated by attaching notation 11 in FIG. 2 and FIG. 3) formed in the respective green sheets A during formation of the punch holes B. The Tungsten paste is subsequently embedded into the through holes 11.

Thereafter, by laminating and subjecting to, for example, a hot press, the respective green sheets A are bonded and in the bonded state, a package base material C used for the original of each package main body 2, is cut out as shown by FIGS. 4B and 4C. Further, by sintering the single unit of the package base material C, the basic structure of the package main body 2 is formed.

Among the tungsten conductive films in the package main body 2, regarding portions exposed at the surface, the conductor pattern 9 for wiring and the conductor pattern 10 for bonding are formed by performing plating treatment. Details of the plating treatment are as follows.

First, an activation treatment is carried out on the tungsten conductive film to form the matrix of plating. An electroless Ni-B plating treatment, which is compatible with the tungsten conductive film, is then performed on tope of the matrix of plating to form a film thickness of about 0.6–1.2 μm. Next, an electroless Ni-P plating treatment is carried out on the Ni-B-plated film to form a film thickness of 4–6 μm. In a general plating treatment, it is normal to form a film by a film thickness of about 2 μm. However, according to the present embodiment, a film thickness twice to three times as much as the normal film thickness is formed. Further, flash plating of a replacement type is performed on the formed Ni-P-plated film to form a film thickness of 0.07 μm or more.

Figure 1:
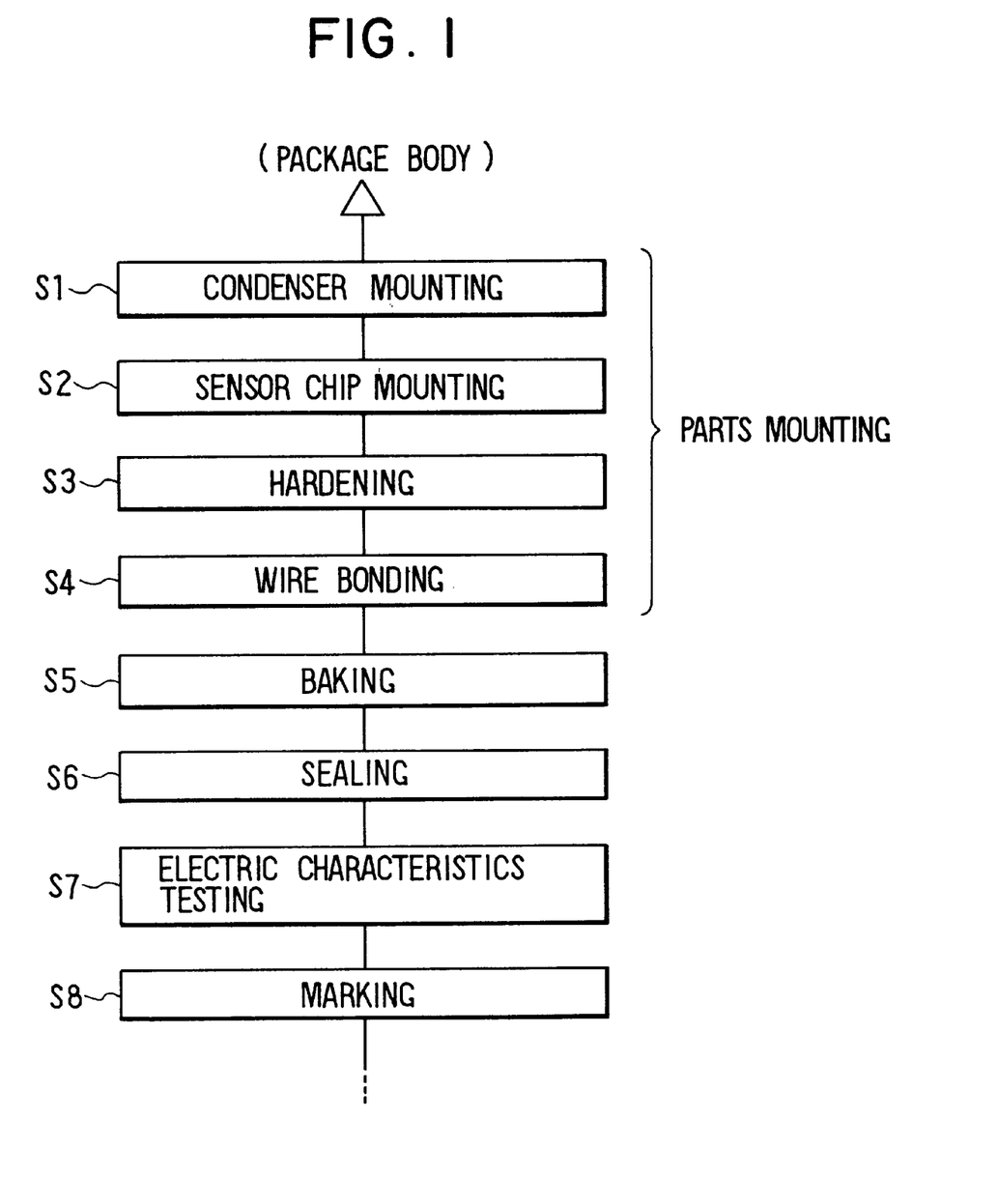
FIG. 1 is a flowchart showing a fabrication process according to an embodiment of the present invention.

FIG. 1 shows fabrication steps used to complete the semiconductor acceleration sensor 1 by utilizing the package main body 2 fabricated as described above. The fabrication steps will be explained, with reference to FIG. 2 and FIG. 3, as well as FIGS. 6A and 6B.

In FIG. 1, a condenser integrating step S1 is carried out. A silicone group conductive paste, such as a silicone group silver paste 12 for wiring pattern, is coated by a dispenser at a position in the cavity 20 for mounting the chip condenser 5. The chip condenser 5 is then mounted at the predetermined position. A necessary amount of the silicone group silver paste 12 is coated at portions in correspondence with electrodes at both ends of the chip condenser 5.

Next, a sensor chip integrating step S2 is carried out. In step S2, a necessary amount of a silicone group die bonding material 13 is coated by a dispenser, or by stamping, at respective positions in the cavity 20 for mounting the semiconductor acceleration sensor chip 3 and the IC chip 4 for signal processing. The sensor chip 3 and the IC chip 4 are then mounted at predetermined positions.

Thereafter, at step S3, a curing treatment of the silicone group silver paste 12 and a curing treatment of the silicone group die bonding material 13 are simultaneously carried out at a temperature of about 150° C. The semiconductor acceleration sensor chip 3, the signal processing IC chip 4 and the chip condenser 5 are thus fixed by this step.

In a successive wire bonding step S4, respective electrode pads (not illustrated) of the semiconductor acceleration sensor chip 3 and the IC chip 4, which have been fixed in the cavity 20 as described above, as well as the respective electrode pads (not illustrated) of the semiconductor acceleration sensor chip 3 and the IC chip 4, and the conductive pattern 10 for bonding on the side of the cavity 20, are connected by bonding wires 14. Preferably, aluminum wire or gold wire or the like may be used for the bonding wire 14.

Here, the condenser integrating step S1, the sensor chip integrating step S2, the curing step S3 and the wire bonding step S4 correspond to part mounting steps according to the present invention.

After finishing the wire bonding step S4, a baking step S5 is carried out. The baking step S5 is carried out as a lot processing for a plurality of package main bodies 2. Specifically, the plurality of package main bodies 2 (in a state prior to sealing the cavity 20 by the cap 6) in each of which the semiconductor acceleration sensor chip 3, the IC chip 4 and the chip condenser 5 are mounted, are moved in a continuous furnace (belt furnace) installed on the fabrication line. The respective package main bodies 2 are heated for a predetermined time period by the furnace such that the temperature of the package main body 2 becomes a predetermined baking temperature, for example, about 380° C.±5° C. (which is a temperature lower than a heat resistant temperature (about 400° C.) of the silicone group silver paste 12 and the silicone group die bonding material 13 used in the package main body 2). The heating time period in this case is set to, for example, 10 minutes.

Incidentally, the inside of the continuous furnace has a nonoxidizing atmosphere using an inert gas or the like such as nitrogen gas or argon gas. Further, in the baking step S5, it is preferable that operation of heating and operation of cooling of the package main body 2 are carried out for a predetermined time period. Therefore, an oven may be used in place of the continuous furnace.

Figure 6A:
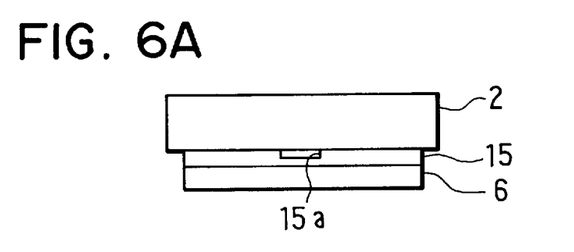
FIGS. 6A and 6B are views schematically showing a side face structure in the midst of fabrication.
Figure 6B:
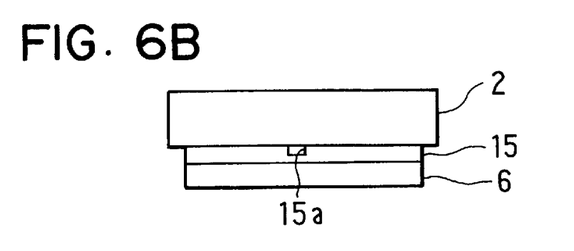

After carrying out the baking step S5, a sealing step S6 is performed after a predetermined cooling time has elapsed. In the sealing step S6, a portion of the cap 6 which is to be brought into contact with the package main body 2, is coated with a sealing material 15 comprising glass having a low melting point. Further, in this case, as shown by FIG. 6A, two gas vent holes 15a (only one location is shown in FIG. 6B) are formed at respective positions in correspondence with both side faces of the package main body 2. The coating operation of the sealing material 15 is carried out twice in order to form such gas vent holes 15a. Further, the width of printing the sealing material 15 is determined in consideration of the size of the package main body 5. In the present embodiment, it is set to, for example, about 0.5 mm.

Next, the cap 6 is arranged at a predetermined position on the package main body 2. The cap is positioned by a jig. Heat treatment is then performed on the package main body 2 in each unit that is brought into the arrangement state. In the arrangement state, the sealing material 15 is interposed between the peripheral edge portion of the cavity 20 in the package main body 2 and the cap 6. The package main body 2 and the cap 6 are then bonded by the sealing material 15, and the semiconductor acceleration sensor 1 is completed. The sealing step S6 is carried out in a nonoxidizing atmosphere using inert gas or the like.

In this case, at step S6, the heating temperature of the package main body 2 in the heat treatment is set to 365° C.±5° C., as the heat resistant temperature of the silicone group silver paste 12 and the silicone group die bonding material 13 used in the package main body 2 is about 400° C. The heating temperature is also set in consideration of the fact that the heating temperature must be lower than the baking temperature (about 380° C.±5° C.) at the baking step S5. The heat treatment time is set to, for example, 10 minutes. Thereby, a relationship of "elapsed time of baking step is equal to or longer than the heat treatment time of sealing step" is satisfied.

Although in carrying out the baking step S5 and the sealing step S6 in accordance with the lot processing, the baking temperature at the baking step S5 and the heating temperature at the sealing step S6 may vary with each of the package main bodies 2. Even under such a situation, the heat treatment is carried out such that a predetermined temperature difference exists between a minimum value of the baking temperature and a maximum value of the heating temperature through adjustment of the atmosphere in a furnace or the atmosphere in an oven.

Further, in order to deal with a situation where the sealing temperature (bonding temperature) of the sealing material 15 is comparatively lower than 365° C.±5° C., glass having a low melting point using PbO-PbF group as mother material and PbO-Ti$_2$O group as filler is used.

Further, in the sealing step, the gas vent hole 15a is initially in an opened state. Therefore, gases generated in the heat treatment are discharged to outside via the gas vent holes 15a. In this case, the softening temperature of the low melting point glass sealing material 15 falls in a range of about 280 through 340° C. Accordingly, the gas vent holes 15a are gradually narrowed as shown by FIG. 6B during the sealing step and are subsequently closed.

After the sealing step S6, an inspecting step S7 is performed. During step S7, electric properties of the semiconductor acceleration sensor 1 are inspected. Next, a marking step S8 is performed in which a product number or similar label is marked on, for example, the cap 6 of the semiconductor acceleration sensor 1 which has passed inspection.

After step S8, the semiconductor acceleration sensor 1, completed as described above, is surface-mounted on a printed circuit board or the like by utilizing the conductor pattern 9 for wiring outside of the package main body 2. The mounting operation is carried out by, for example, solder reflow processing.

According to the above fabrication method, the baking step S5 is carried out for 10 minutes or more prior to the sealing step S6 where the package main body 2 and the cap 6 are bonded by the sealing material 15.

When the baking step S6 is carried out, the silicone group silver paste 12 and the silicone group die bonding material 13 used in the cavity 20 are thermally decomposed and gases are generated, and are discharged outside of the cavity 20.

Thereafter, the sealing step S6 is performed in which the heating temperature of the package main body in the heat treatment of the sealing step is about 365° C.±5° C. lower than the baking temperature (about 380° C.±5° C.) in the baking step S5. Therefore, the amount of thermally decomposed gases generated from the silicone group silver paste 12 and the silicone group die bonding 13 is considerably reduced compared with that in the case where the baking step S5 is not carried out.

Accordingly, there is no concern of considerably increasing the inner pressure of the cavity 20 accompanied by the execution of the sealing step S6 and the phenomenon of thinning the bond width of the seal portion, or the phenomenon of inclining the cap 6 from a regular attaching state or the like owing to the elevation of the inner pressure is not caused. As a result, the seal reliability can be ensured without deterioration in the quality of the semiconductor acceleration sensor 1 and without resulting failure caused by inclination of the cap in surface-mounting the semiconductor acceleration sensor 1.

Further, the following mechanism reduced the amount of thermally-decomposed gases generated in the sealing step S6 when the baking step S5 is executed as described above. That is, regarding the silicone group silver paste 12 and the silicone group die bonding material 13 for constituting sources of generating thermally-decomposed gases, the weight is reduced in accordance with the heating operation. The amount of weight reduction determines the amount of thermally-decomposed gases that is generated. The amount of weight reduction is increased in accordance with elevation of the heating temperature.

Figure 7:
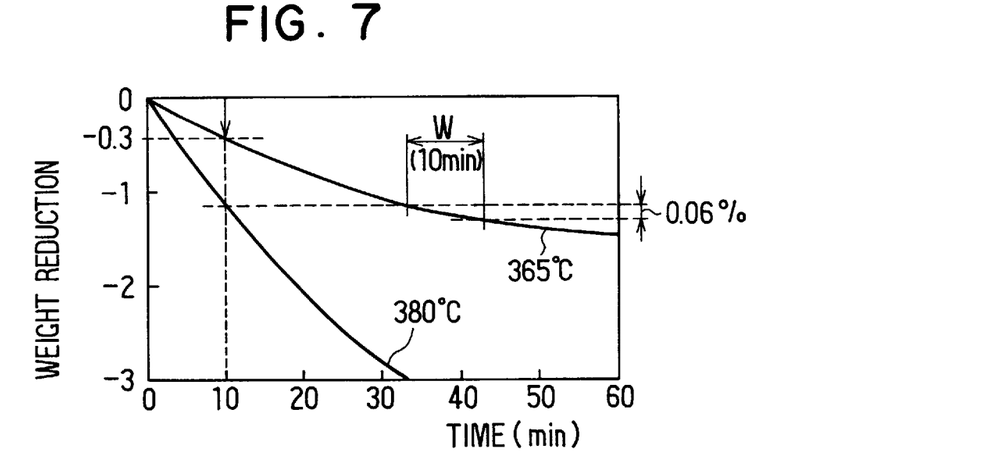
FIG. 7 is a characteristics graph showing a relationship between heat treating time and an amount of reduction in weight.

For example, when the silicone group silver paste 12 is continuously subjected to the heat treatment in the respective states of the heating temperature at 365° C. and 380° C., a relationship between the heat treatment time and the reduction amount of the weight constitutes the characteristic shown by FIG. 7. FIG. 7 shows that the weight reduction in the case where the heating is carried out at 360° C. for 10 minutes is about 0.3%. Thus, in the case where only the sealing step S6 is carried out for 10 minutes (at heating temperature of 360° C.±5° C.) without carrying out the baking step S5 in the embodiment, it is known that weight reduction of the silicone group silver paste at the sealing step S6 is about 0.3%.

Further, FIG. 7 shows that the weight reduction in the case where the heating is carried out at 365° C. for 10 minutes after carrying out the heating operation at 380° C. for 10 minutes (portion designated by notation W in FIG. 7) is about 0.06%. That is, in the case where the sealing step S6 is carried out (at heating temperature of 365° C.±5° C.) after carrying out the baking step S5 according to the embodiment for 10 minutes (at heating temperature of 380° C.±5° C.), the weight reduction of the silicone group silver paste 12 at the sealing step S6 is only about 0.06%.

Further, when the baking step S5 is carried out prior to the sealing step S6, the amount of the weight reduction in the sealing step S6 is reduced also in respect of the silicone group die bonding material 13. In this way, as a result of restraining the weight reduction of the silicone group silver paste 12 and the silicone group die bonding material 13, the amount of generated thermally-decomposed gases in the sealing step S6 is reduced.

According to the present embodiment, the heat treatments at the baking step S5 and the sealing step S6 are carried out for a plurality of the package main bodies 2. Therefore, increased productivity can be realized. In this case, the package main bodies 2 in the lot are subjected to the baking step S6, where the heating operation is carried out at the baking temperature (380° C.±5° C.). The baking step is set higher than the heating temperature (365° C.±5° C.) at the sealing step S6, and is carried out for a predetermined time period (10 minutes). Thus, when the lot processing is carried out, even in a situation where the baking temperature at the baking step S5 and the heating temperature at the sealing step S6 varies among the package main bodies 2 (situation where temperature differs by position in furnace), a predetermined temperature difference exists between the minimum value of the baking temperature and the maximum value of the heating temperature (in this embodiment, 5° C. because the minimum value of the baking temperature is 375° C. and the maximum value of the heating temperature is 370° C.). Accordingly, an increase in the inner pressure of the cavity 20 can be restrained in all of the package main bodies 2 in the lot as mentioned above.

Further, the baking step S6 is carried out for a time period that is equal to or longer than a time period of the heat treatment at the sealing step S5. Therefore, the amount of thermally decomposed gases generated in the sealing step S5 is reduced. Accordingly, the increase in the inner pressure of the cavity 20 can further be restrained.

Further, according to the present embodiment, the low melting point glass is used as the sealing material 15. Further, the package main body 2 and the cap 6 are formed by alumina, a ceramic material having a melting point sufficiently higher than the melting point of the sealing material 15. Accordingly, a space sealed by the sealing material 15, that is, the airtight state of the cavity 20, can be maintained over a long period of time. Further, a special fabrication process, as in the case where high temperature solder is used as the sealing material, is not needed, thereby realizing a reduction in manufacturing cost.

The silicone group die bonding material 13 having a low Young's modulus is used for die-bonding the semiconductor acceleration sensor chip 3. Accordingly, deterioration in the detection accuracy of the conductor acceleration sensor chip 3 can be prevented beforehand.

Both the baking temperature at the baking step S5 and the heating temperature at the sealing step S6 are set to temperatures lower than the heat resistant temperatures of the silicone group silver paste 12 and the silicone group die bonding 13 used in the package main body 2. Accordingly, thermal deterioration in the silicone group silver paste 12 and the silicone group die bonding material 13 can be prevented.

Further, the baking step S5 and the sealing step S6 are carried out in a nonoxidizing atmosphere using inert gas and therefore, a situation where metal portions in the semiconductor acceleration sensor 1 (for example, plated portions and matrix portions of these) are oxidized by the temperature rise accompanied by the execution of the baking step S5 and the sealing step S6 can effectively be prevented.

Here, an explanation will be given of a result of a survey concerning disadvantage in carrying out the sealing step S6 without performing the baking step S5 to clarify the basis of achieving the above-described effect.

That is, the inventors of the present invention discovered a phenomenon where the bond width of the sealing material 15 was thinned less than a predicted width as a result of performing transmission X-ray observation for a sample which had been subjected to the sealing step S6 but not the baking step S5. After being subjected to the condenser integrating step S1, the sensor chip integrating step S2, the curing step S3 and the wire bonding step S4. Such a phenomenon seems to cause the inner pressure of the cavity 20 to be increased by thermally-decomposed gases generated from the silicone group silver paste 12 and the silicone group die bonding material 13.

The above-described sample was obtained in a state where load was not applied on the cap 6 in the closing direction at the sealing step S6. However, a sample which had been subjected to the sealing step S6 in a state where load of about 1 Kgf was applied on the cap 6 (naturally, baking step S5 was not performed) was prepared and the sample was investigated by removing the cap 6. The sealing material 15 adhered to the cap 6 was brought into a state as shown by FIG. 8.

Figure 8:
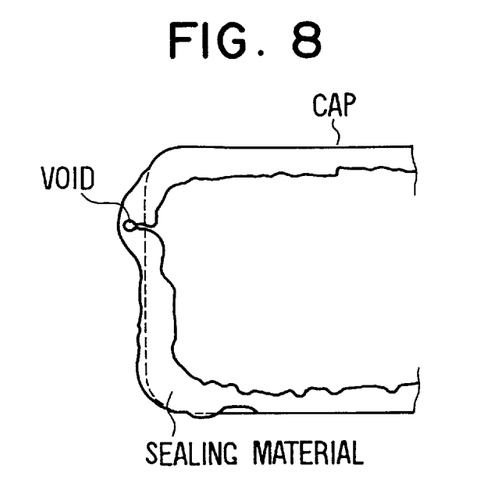
FIG. 8 is a view schematically showing a portion of a rear face of a cap for explaining limitations of a conventional fabrication method.

According to FIG. 8, the portion of the rear face of the cap 6 which was removed as described above is schematically illustrated. It is known from FIG. 8 that a void is caused in the sealing material 15 since thermally decomposed gases generated in the state where load was applied on the cap 6 could not escape. Such a void is apparently caused with some degree of probability even when the normal sealing step S6, where load is not applied on the cap 6 in the closing direction, is performed. However, this phenomenon creates a situation where the cap 6 must be inclined from a regular attaching state as described above.

In order to quantitatively grasp the phenomenon of increasing the inner pressure of the cavity 20 in the case where the baking step S5 was not carried out, the inventors of the application measured to what degree the amount of gases were generated at the cavity 20 of the semiconductor acceleration sensor 1 with respect to an actual product when the sealing step S6 was carried out without the baking step S5. It was found that, when the temperature and the time of the heat treatment in the sealing step S6 were set to 365° C. and 10 minutes, respectively, about $36 \times 10^{-3}$ cm$^3$ of gases were generated from the silicone group silver paste 12, and the silicone group die bonding material 13 by which the pressure in the cavity 20 was increased by about 0.5 atm (incidentally, effective volume of the cavity 20 was $64 \times 10^{-3}$ cm$^3$).

By contrast, when the amount of gases generated at the sealing step S6 was measured with respect to the semiconductor acceleration sensor 1 which had successively been subjected to the baking step S5 (baking temperature 380° C.×10 minutes) and the sealing step S6 (heat treatment temperature 365° C.×10 minutes) in the fabrication procedure, the value became about $9.8 \times 10^{-3}$ cm$^3$. In this case, the increase in the pressure of the cavity 20 was restrained to about 0.15 atm. Accordingly, a concern over the above-described operation of the embodiment, that is, the considerable increase in the inner pressure of the cavity 20 in executing the sealing step S6, is eliminated, and the phenomenon of thinning the bond width at the seal portion caused by the increase in the inner pressure does not occur.

Figure 9A:
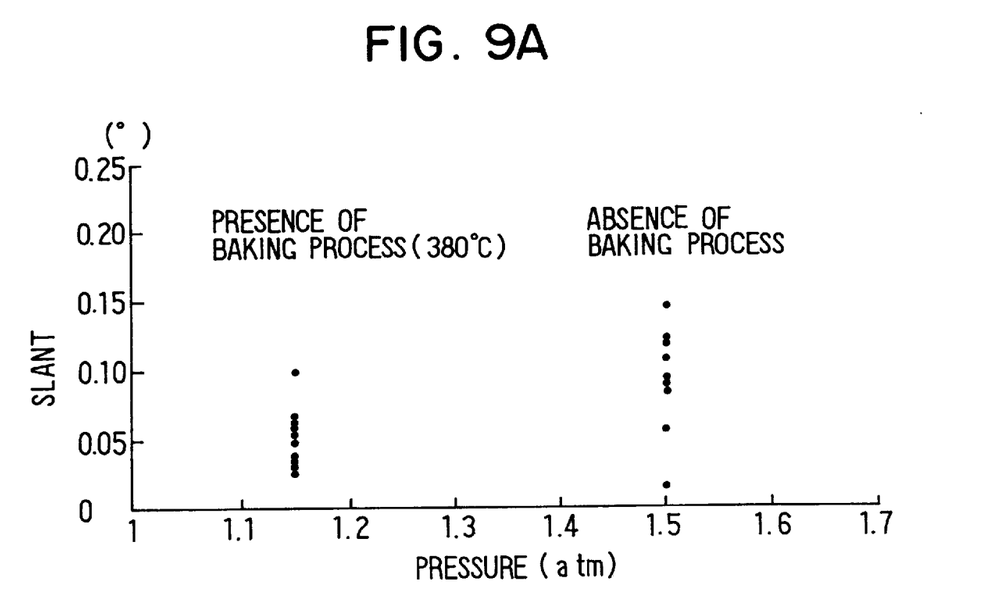
FIGS. 9A and 9B are diagrams showing relationships between an inner pressure of a cavity and inclination of a cap, and between the inner pressure of the cap and a seal width in respect of a plurality of samples.
Figure 9B:
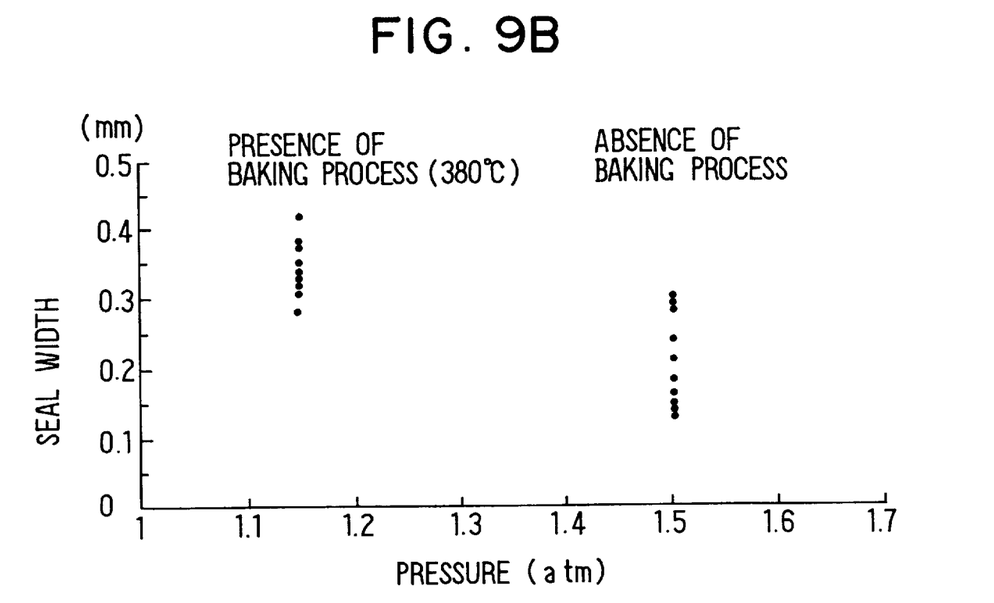
Figure 10:
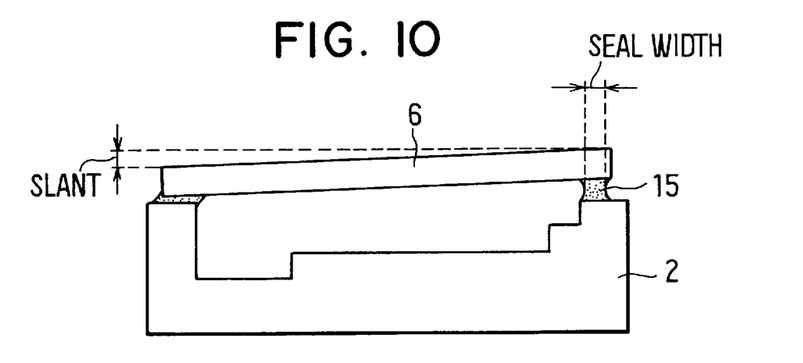
FIG. 10 is an outline side view of a semiconductor acceleration sensor showing an amount of a cap inclination.

Further, FIGS. 9A and 9B show results of forming 10 pieces of samples for each of the semiconductor acceleration sensor 1, which has successively been subjected to the baking step S5 and the sealing step S6, and the semiconductor acceleration sensor 1 which has been subjected to the sealing step S6 without executing the baking step S5. Distributions with respect to relationships between inner pressure of the cavity 20 and the inclination of the cap 6, as well as inner pressure of the cavity 20 and the seal width (bond width of seal portion by sealing material 15) with respect to these were samples investigated to clarify the effect of the embodiment. Incidentally, the inclination of the cap 6 was obtained as a value illustrated by FIG. 10 (long side dimension of cap 6; about 10 mm).

Still referring to FIG. 9, when the inclination of the cap 6 is surveyed, in the case where the baking step S5 has been carried out, variation between samples is reduced. Further, the cap inclination is relatively reduced (about 0.10 mm at maximum). By contrast, in the case where the baking step S5 has not been carried out, cap inclination tends to be considerable.

Further, when the seal width is surveyed, in the case where the baking step S5 has been carried out, a seal width of about 0.2 mm can be secured at minimum. By contrast, in the case where the baking step S5 has not been carried out, the seal width may be thinned less than about 0.15 m, with 0.15 mm being an allowable lower limit value.

According to the present embodiment, in the sealing step S6, the width of the sealing material 15, which is coated at a portion of the cap 6 in contact with the package main body 2, is set to about 0.5 mm immediately after printing the sealing material 15. Preferably, the seal width after carrying out the sealing step S5 is as near to 0.5 mm as possible. When the baking step S5 is carried out, the seal width can be secured. When the baking step S5 is not carried out, the seal width may become ⅓ the width, or smaller, of the sealing material width immediately after printing. Thus, seal reliability is deteriorated, giving rise to deterioration in quality of the sample.

Further, the present invention is not limited to the above-described embodiments but can be modified or expanded as follows.

Although the package main body 2 and the cap 6 are formed by alumina, the components may be formed by other ceramic material, or by glass or heat resistant resin. Although the lower melting point glass of glass mother material/PbO/PbF group, filler/PbO-Ti$_2$O group is used as the sealing material 15, low melting point glass having other composition may be used, or other material may be used.

Although an explanation has been given of an example of the semiconductor acceleration sensor 1 using the silicone group silver paste 12 and the silicone group die bonding material 13, the present invention is applicable to an electronic circuit device using other conductive paste and other die bonding agents. Further, the present invention is widely applicable to a general electronic circuit device which is fabricated by a procedure accompanied by a step of mounting electronic parts by using at least one of a die bonding material and a conductive paste for wiring.

Although an explanation has been given of a semiconductor acceleration sensor used in an air bag system, the present invention is applicable to a semiconductor acceleration sensor for ABS or other kinematic amount sensors (yaw rate sensor, angular velocity sensor, vibration sensor or the like). It is also applicable to a pressure sensor for detecting an intake pressure of an engine or the like, a high pressure sensor for detecting a coolant pressure of an air conditioner or hydraulic pressure as well as a high temperature sensor, a magnetism sensor, or a radiation sensor. Naturally, an electronic circuit device of an object of fabrication is not limited to a sensor but is widely applicable to a general electronic circuit device mounted with electronic parts including a resistor circuit net, an RC circuit net and the like.

What is claimed is:

1. A method of fabricating an electronic circuit device comprising:

mounting an electronic part in a cavity formed in a package main body by using a bonding material comprising at least one of a die bonding material and a conductive paste for wiring;

bonding the package main body and a cap by performing a heat treatment while a sealing material is interposed between a peripheral edge portion of the cavity in the package main body and the cap whereby the cavity is sealed in an airtight manner; and baking the package main body and the mounted electronic part to a baking temperature set higher than a heating temperature of the heat treatment for a predetermined time period prior to the bonding step, wherein said baking of said package main body generates gases by thermally decomposing said bonding material, said gases being discharged outside of said package main body.

2. The method of fabricating an electronic device according to claim 1, wherein the baking step and the bonding step are carried out as lot processings of a plurality of pieces of the package main bodies.

3. The method of fabricating an electronic device according to claim 2, wherein baking temperatures at the baking step and the bonding step vary between the package main bodies, and the heat treatment is carried out such that a predetermined temperature difference exists between a minimum value of the baking temperature and a maximum value of the heating temperature.

4. The method of fabricating an electronic circuit device according to claim 1, wherein the baking step is carried out for a time period at least as long as a time period of the heat treatment.

5. The method of fabricating an electronic circuit device according to claim 1, wherein glass is used as a sealing material and the package main body and the cap are formed by a material having a melting point sufficiently higher than a melting point of the glass.

6. The method of fabricating an electronic circuit device according to claim 5, wherein the package main body and the cap comprise a ceramic material.

7. The method of fabricating an electronic circuit device according to claim 1, wherein the electronic part comprises a kinematic amount sensor chip, and the kinematic amount sensor chip is mounted inside of the cavity by a silicone group die bonding material.

8. The method of fabricating an electronic circuit device according to claim 1, wherein a wiring comprising a silicone group conductive paste is used for the electronic part.

9. The method of fabricating an electronic circuit device according to claim 1, wherein the heating temperature at the bonding step is set to substantially 365° C.±5° C. and the baking temperature at the baking step is set to substantially 380° C.±5° C.

10. The method of fabricating an electronic circuit device according to claim 1, wherein the baking step and the bonding step are carried out in a nonoxidizing atmosphere using an inert gas.

11. A method of forming an electronic circuit device, comprising:

providing a package main body that includes a predetermined wiring structure and that defines a component cavity;

placing an electronic component within the component cavity in electronic communication with the wiring structure;

applying a bonding material to bond the electronic component to the wiring structure;

baking the package main body to cure the bonding material and thereby permanently secure the electronic component within the component cavity, and to discharge gases formed during an initial heating of the conductive material to minimize gases formed during subsequent heatings, said baking of said package main body generating said gases by thermally decomposing said bonding material, said gases being discharged outside said package main body;

affixing a cap to the baked package main body around the component cavity with a sealing material to seal the electronic component within the component cavity in an airtight manner; and heating the package main body, the cap and the sealing material to permanently secure the cap to the baked package main body in a manner that minimizes gas pressure buildup inside the sealed component cavity, wherein the baking step is performed before the affixing step and at a greater temperature than the affixing step.

12. The method of claim 11, wherein said heating step and said baking step are performed so that a predetermined time period and a predetermined temperature difference exists therebetween.

13. The method of claim 12, wherein said baking step is performed at a temperature that is above a temperature at said affixing step.

14. The method of claim 11, wherein said affixing step comprises affixing a cap to the baked package main body with a sealing material that has a melting point that is sufficiently lower than that of the package main body and the cap.

15. The method of claim 11, wherein said affixing step further comprises forming at least one gas vent hole on a side face of the package main body to discharge gases formed during said sealing step, said sealing step causing the at least one gas vent hole to gradually close.

* * * * *

UNITED STATES PATENT AND TRADEMARK OFFICE
CERTIFICATE OF CORRECTION

PATENT NO. : 6,100,108
DATED : August 8, 2000
INVENTOR(S) : MIZUNO et al.

It is certified that error appears in the above-identified patent and that said Letters Patent is hereby corrected as shown below:

On the title page:

UNDER

"[30]", please insert - - JP 9-31798 filed February 17, 1997 and JP 10-5565 filed January 14, 1998 - -

Signed and Sealed this

Twenty-fourth Day of April, 2001

*Attest:*

NICHOLAS P. GODICI

*Attesting Officer*     *Acting Director of the United States Patent and Trademark Office*